(12) United States Patent
Tajimi

(10) Patent No.: US 7,687,321 B2
(45) Date of Patent: Mar. 30, 2010

(54) METHOD FOR MANUFACTURING SEMICONDUCTOR DEVICE

(75) Inventor: Shigehisa Tajimi, Shonai (JP)

(73) Assignee: Seiko Epson Corporation (JP)

( * ) Notice: Subject to any disclaimer, the term of this patent is extended or adjusted under 35 U.S.C. 154(b) by 84 days.

(21) Appl. No.: 11/854,597

(22) Filed: Sep. 13, 2007

(65) Prior Publication Data

US 2008/0064146 A1 Mar. 13, 2008

(30) Foreign Application Priority Data

Sep. 13, 2006 (JP) ............................. 2006-248324

(51) Int. Cl.
*H01L 21/00* (2006.01)

(52) U.S. Cl. ..................................................... 438/127

(58) Field of Classification Search ................ 438/127, 438/123, 111, 112, 106; 257/E23.129, 668, 257/676, 789, 701
See application file for complete search history.

(56) References Cited

U.S. PATENT DOCUMENTS

| | | | |
|---|---|---|---|
| 5,935,375 A | 8/1999 | Nakazawa et al. | |
| 6,191,024 B1 | 2/2001 | Nakazawa et al. | |
| 6,379,484 B2 | 4/2002 | Nakazawa et al. | |
| 2001/0000754 A1* | 5/2001 | Nakazawa et al. | 438/106 |
| 2006/0170085 A1* | 8/2006 | Fukuta et al. | 257/676 |

FOREIGN PATENT DOCUMENTS

| | | |
|---|---|---|
| JP | 07-106358 | 4/1995 |
| JP | 10-050769 | 2/1998 |
| JP | 2006-216720 | 8/2006 |

* cited by examiner

*Primary Examiner*—Thomas L Dickey
*Assistant Examiner*—Nikolay Yushin
(74) *Attorney, Agent, or Firm*—Harness, Dickey & Pierce, P.L.C.

(57) ABSTRACT

A method for manufacturing a semiconductor device, the method includes: moving a nozzle around a semiconductor chip bonded to a wiring substrate by face-down bonding; and continuously supplying underfill material through the nozzle, thereby filling the underfill material between the wiring substrate and the semiconductor chip, wherein an outline of a surface of the semiconductor chip opposing to the wiring substrate is a polygon composed of a plurality of sides, a moving track of the nozzle includes a linear track within a range of a pair of line segments drawn from both ends of each of the sides perpendicularly to said each of the sides, and a direction changing track that continuously connects adjacent ones of the linear tracks, wherein the nozzle is moved slower in at least a portion of the linear track than in the direction changing track.

6 Claims, 1 Drawing Sheet

$V_1 < V_3$ $V_1 \leq V_2$ $V_2 \leq V_3$ $V_1 < V_3$ $V_1 \leqq V_2$ $V_2 \leqq V_3$

METHOD FOR MANUFACTURING SEMICONDUCTOR DEVICE

The entire disclosure of Japanese Patent Application No. 2006-248324, filed Sep. 13, 2006 is expressly incorporated by reference herein.

BACKGROUND

1. Technical Field

The invention relates to a method for manufacturing a semiconductor device.

2. Related Art

A semiconductor chip may be bonded to a wiring substrate by face-down bonding, and underfill material may be filled between the semiconductor chip and the wiring substrate. The underfill material may generally be supplied from a tip of a nozzle, but it is difficult to supply the underfill material without riding on the semiconductor chip.

Japanese Laid-open Patent Application JP-A-07-106358 describes face-down bonding and filling of underfill material (in particular, improvement of resin flowability), but does not describe supplying underfill material in a manner not to ride on a semiconductor chip.

SUMMARY

In accordance with an aspect of an embodiment of the present invention, underfill material can be supplied without riding on a semiconductor chip.

(1) A method for manufacturing a semiconductor device in accordance with an embodiment of the invention includes: moving a nozzle around a semiconductor chip bonded to a wiring substrate by face-down bonding, and continuously supplying underfill material through the nozzle, thereby filling the underfill material between the wiring substrate and the semiconductor chip, wherein an outline of a surface of the semiconductor chip opposing to the wiring substrate is a polygon composed of a plurality of sides, a moving track of the nozzle includes a linear track within a range of a pair of line segments drawn from both ends of each of the sides perpendicularly to said each of the sides, and a direction changing track that continuously connects adjacent ones of the linear tracks, and the nozzle is moved slower in at least a portion of the linear track than in the direction changing track.

According to the present embodiment, the nozzle is moved slower in at least a portion of the linear track than in the direction changing track. In other words, the nozzle is moved faster in the direction changing track, such that the amount of supply of underfill material can be reduced in the direction changing track. The direction changing track corresponds to each of the corner sections of the semiconductor chip. Conventionally, underfill material would often ride on the semiconductor chip at the corner sections. However, in accordance with the present embodiment, underfill material can be supplied without riding on the semiconductor chip.

(2) In the method for manufacturing a semiconductor device in accordance with an aspect of the embodiment, the linear track located upstream of the direction changing track includes, in a moving direction of the nozzle, a connecting track that directly connects to the direction changing track, and a non-connecting track that does not directly connect to the direction changing track on a downstream side thereof due to inclusion of the connecting track, wherein the nozzle may be moved faster in the connecting track than in the non-connecting track.

(3) In the method for manufacturing a semiconductor device in accordance with an aspect of the embodiment, the nozzle may be moved at the same speed in the connecting track and the direction changing track.

(4) In the method for manufacturing a semiconductor device in accordance with an aspect of the embodiment, the linear track located upstream of the direction changing track includes, in a moving direction of the nozzle, a connecting track that directly connects to the direction changing track, and a non-connecting track that does not directly connect to the direction changing track on a downstream side thereof due to inclusion of the connecting track, wherein the nozzle may be moved slower in the non-connecting track than in the direction changing track.

DESCRIPTION OF EXEMPLARY EMBODIMENTS

Preferred embodiments of the invention are described below with reference to the accompanying drawings.

Figure 1:
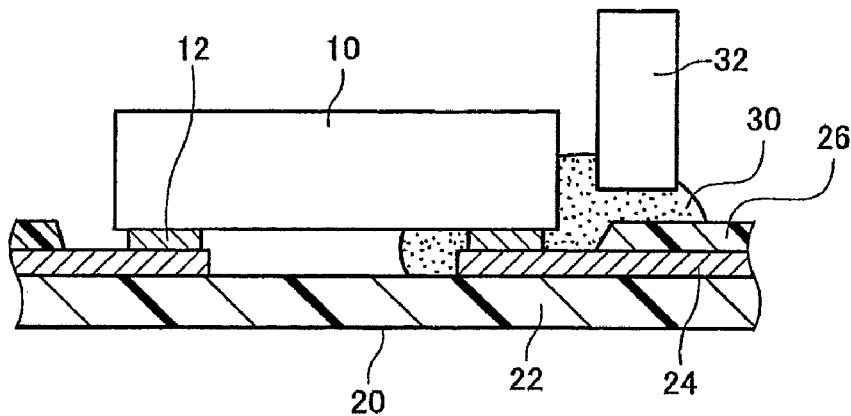
FIG. 1 is a view showing a step of a method for manufacturing a semiconductor device in accordance with an embodiment of the invention.

FIG. 1 shows a method for manufacturing a semiconductor device in accordance with an embodiment of the invention. In the present embodiment, a semiconductor chip 10 and a wiring substrate 20 are used. The semiconductor chip 10 includes a plurality of electrodes 12. The electrodes 12 may be each formed from a pad composed of aluminum or the like and a bump composed of gold or the like disposed on the pad. The electrodes 12 are electrically connected to an integrated circuit (not shown) formed in the semiconductor chip 10. The outline of a surface of the semiconductor chip 10 where the electrodes 12 are formed (a surface thereof opposing to the wiring substrate 20) is a polygon composed of a plurality of sides (for example, a rectangle).

The wiring substrate 20 includes a substrate composed of resin or the like (for example, a flexible substrate) 22, and a wiring pattern 24 composed of metal such as copper formed on one surface of the substrate 22. A protective layer of resin (such as, a solder resist layer) 26 is formed on the substrate 22 except a portion thereof. The protective layer 26 covers the wiring pattern 24 except a portion thereof. In an exposed area of the substrate 22 exposed through the protective layer 26, an exposed portion of the wiring pattern 24 exposed through the protective layer 26 is located. No through hole is formed in an exposed area of the substrate 22 in the exposed area of the protective layer 26 where the wiring pattern 24 is exposed through the protective layer 26.

In the present embodiment, the semiconductor chip 10 is bonded to the wiring substrate 20 by face-down bonding. Then the electrodes 12 and the wiring pattern 24 are connected together. The connection may be made through metal joint (brazing and soldering—solid state diffusion bonding joint). No through hole is formed in an area of the substrate 22 where it opposes to the semiconductor chip 10. A gap is formed between the semiconductor chip 10 and the substrate 22 face-down bonded together. Underfill material 30 is filled in the gap.

The underfill material 30 is supplied through a nozzle 32. The nozzle 32 is moved around the semiconductor chip 10, and underfill material 30 is continuously supplied through the nozzle 32. The nozzle 32 is moved with a distance away from the semiconductor chip 10. When the semiconductor chip 10 has a rectangular plane configuration, the nozzle 32 is moved in its circumference along at least two or more of the sides (two sides, three sides or four sides). In other words, the nozzle 32 is moved in a track in an L-letter shape, a channel shape or a rectangular shape. The rate of supplying the underfill material 30 through the nozzle 32 may be constant. The underfill material 30 is filled between the wiring substrate 20 and the semiconductor chip 10 in a manner described above.

Figure 2:
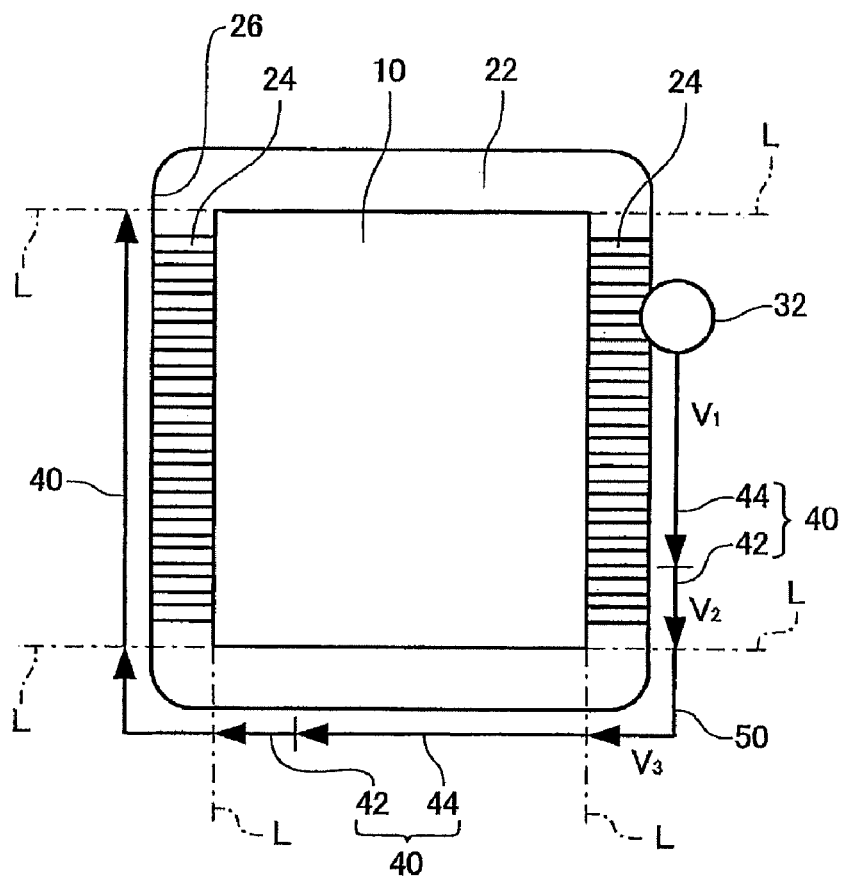
FIG. 2 is a view for describing moving tracks of a nozzle.

FIG. 2 is a view for describing a moving track of the nozzle. The moving track of the nozzle 32 traces at least a portion of a similar shape of the plane configuration of the semiconductor chip 10. The moving track of the nozzle 32 also passes in a region adjacent to at least a corner of the semiconductor chip 10. The moving track of the nozzle 32 includes a linear track 40 extending in a range between a pair of line segments L drawn from both ends of each of the sides of the semiconductor chip 10, perpendicularly to that side, and a direction changing track 50 that continuously connects adjacent ones of the linear tracks 40, for changing the direction of the linear track. The linear track 40 may be in parallel with the side of the semiconductor chip 40.

The supply of the underfill material 30 starts in the linear track 40. The first linear track 40 may have a starting point in the range between the line segments L, as shown in FIG. 2, or may start from a point on the line segment L in accordance with a modified example. Also, the supply of the underfill material 40 ends in the linear track 40. The last linear track 40 may end at a point on the line segment L, as shown in FIG. 2, or may have an end point in the range between the line segments L, in accordance with a modified example.

The linear track 40 includes, in a moving direction of the nozzle 32, a connecting track 42 that directly connects to the direction changing track 50 in its downstream side, and a non-connecting track 44 that does not directly connect to the direction changing track 50 due to inclusion of the connecting track 42. It is noted that the last linear track 40 does not have a connecting track 42 as it does not have a direction changing track 50 in its downstream, as shown in FIG. 2.

In accordance with the present embodiment, the nozzle 32 is moved faster in the direction changing track 50 (at a speed of $V_3$) than at least in a portion of the liner track 40 (for example, in the non-connecting track 44 at a speed of $V_1$)) ($V_1 < V_3$) excepting a portion thereof immediately before the direction changing track 50 (for example, the connecting section 42 at a speed of $V_2$). For example, the speed $V_3$ in the direction changing track 50 may be 1.3-2 times the speed $V_1$ in the non-connecting section 44. Alternatively, the nozzle 32 may be moved faster in the direction changing track 50 than in the entire linear track 40 ($V_1 < V_3$, $V_2 < V_3$).

By so doing, the supply amount of the underfill material 30 can be reduced in the direction changing track 50. The direction changing track 50 corresponds to each corner section of the semiconductor chip 10. The underfill material 30 would often ride onto the semiconductor chip 10 at the corner section in the past. However, in accordance with the present embodiment, the underfill material 30 can be supplied without riding on the semiconductor chip 10. It is noted that the underfill material 30 may be provided in contact with the side surface of the semiconductor chip 10 bulging above the upper surface thereof, as long as it does not ride on the semiconductor chip 10.

It is noted that the nozzle 32 may be moved at the same speed in the connecting track 42 and the non-connecting track 44 ($V_1 = V_2$), or the nozzle 32 may be moved faster in the connecting track 42 than in the non-connecting track 44 ($V_1 < V_2$). The nozzle 32 may be moved at the same speed in the connecting track 42 and the direction changing track 50 ($V_2 = V_3$). The nozzle 32 may be moved faster in the direction changing track 50 than in the connecting track 42 ($V_2 < V_3$).

By lowering the affinity of the protective layer 26 to the underfill material 30, the protective layer 26 repels the underfill material 30 such that the underfill material 30 can be flowed more readily in the gap between the semiconductor chip 10 and the wiring substrate 20. By the method including the process described above, semiconductor devices can be manufactured.

The invention is not limited to the embodiment described above, and many modifications can be made. For example, the invention may include compositions that are substantially the same as the compositions described in the embodiment (for example, a composition with the same function, method and result, or a composition with the same objects and result). Also, the invention includes compositions in which portions not essential in the compositions described in the embodiment are replaced with others. Also, the invention includes compositions that achieve the same functions and effects or achieve the same objects of those of the compositions described in the embodiment. Furthermore, the invention includes compositions that include publicly known technology added to the compositions described in the embodiment.

What is claimed is:

1. A method for manufacturing a semiconductor device, the method comprising:
    moving a nozzle along a moving track around a semiconductor chip bonded to a wiring substrate by face-down bonding; and
    continuously supplying underfill material through the nozzle while moving the nozzle along the moving track, thereby filling the underfill material between the wiring substrate and the semiconductor chip, wherein
    an outline of a surface of the semiconductor chip opposing to the wiring substrate is a polygon composed of a plurality of sides,
    the moving track of the nozzle includes a plurality of linear tracks, each being within a range of a pair of respective line segments that are perpendicular to a respective one of the plurality of sides, and a non-linear direction changing track that continuously connects adjacent ones of the linear tracks around a corner region of the semiconductor device, and
    the nozzle is moved slower in at least a portion of the linear track than in the non-linear direction changing track.

2. A method for manufacturing a semiconductor device, the method comprising:
    moving a nozzle along a moving track around a semiconductor chip bonded to a wiring substrate by face-down bonding: and
    continuously supplying underfill material through the nozzle while moving the nozzle along the moving track, thereby filling the underfill material between the wiring substrate and the semiconductor chip, wherein
    an outline of a surface of the semiconductor chip opposing to the wiring substrate is a polygon composed of a plurality of sides,
    the moving track of the nozzle includes a plurality of linear tracks, each being within a range of a pair of respective line segments that are perpendicular to a respective one of the plurality of sides, and a non-linear direction changing track that continuously connects adjacent ones of the linear tracks around a corner region of the semiconductor device,
    the nozzle is moved slower in at least a portion of the linear track than in the non-linear direction changing track, and the linear track located upstream of the non-linear direction changing track includes a connecting track that directly connects to the non-linear direction changing track and a non-connecting track that does not directly connect to the non-linear direction changing track, and the nozzle is moved faster in the connecting track than in the non-connecting track.

3. A method for manufacturing a semiconductor device according to claim 2, wherein the speed in the direction changing track is approximately 1.3 to 2 times the speed in the non-connecting track.

4. A method for manufacturing a semiconductor device according to claim 2, wherein the nozzle is moved in the connecting track and the non-linear direction changing track at an equal speed.

5. A method for manufacturing a semiconductor device, the method comprising:

moving a nozzle along a moving track around a semiconductor chip bonded to a wiring substrate by face-down bonding; and continuously supplying underfill material through the nozzle while moving the nozzle along the moving track, thereby filling the underfill material between the wiring substrate and the semiconductor chip, wherein an outline of a surface of the semiconductor chip opposing to the wiring substrate is a polygon composed of a plurality of sides, the moving track of the nozzle includes a plurality of linear tracks, each being within a range of a pair of respective line segments that are perpendicular to a respective one of the plurality of sides, and a non-linear direction changing track that continuously connects adjacent ones of the linear tracks around a corner region of the semiconductor device, the nozzle is moved slower in at least a portion of the linear track than in the non-linear direction changing track, and the linear track located upstream of the non-linear direction changing track includes a connecting track that directly connects to the non-linear direction changing track and a non-connecting track that does not directly connect to the non-linear direction changing track, and the nozzle is moved slower in the non-connecting track than in the non-linear direction changing track.

6. A method for manufacturing a semiconductor device according to claim 5, wherein the speed in the direction changing track is approximately 1.3 to 2 times the speed in the non-connecting track.

* * * * *